United States Patent [19]
Thomann et al.

[11] Patent Number: 5,656,974
[45] Date of Patent: Aug. 12, 1997

[54] ATOMIC FREQUENCY OSCILLATOR

[75] Inventors: Pierre Thomann, Fontainemelon; Alain Jornod, Colombier, both of Switzerland

[73] Assignee: Observatoire Cantonal de Neuchatel, Neuchatel, Switzerland

[21] Appl. No.: 611,404

[22] Filed: Mar. 6, 1996

[30] Foreign Application Priority Data

Mar. 14, 1995 [EP] European Pat. Off. ............ 95810169

[51] Int. Cl.$^6$ ............................. H03B 17/00; H03L 7/26
[52] U.S. Cl. ................................. 331/3; 331/94.1
[58] Field of Search .......................... 331/3, 94.1

[56] References Cited

U.S. PATENT DOCUMENTS

| | | | |
|---|---|---|---|
| 5,195,102 | 3/1993 | McLean et al. | 372/34 |
| 5,387,881 | 2/1995 | Schweda et al. | 331/94.1 |
| 5,442,326 | 8/1995 | Liberman | 331/94.1 |
| 5,553,087 | 9/1996 | Telle | 331/94.1 |

FOREIGN PATENT DOCUMENTS

| | | |
|---|---|---|
| 0 396 875 | 11/1990 | European Pat. Off. . |
| 0 411 131 | 2/1991 | European Pat. Off. . |
| 0 414 194 | 2/1991 | European Pat. Off. . |
| 0 479 118 | 4/1992 | European Pat. Off. . |
| 0 561 261 | 9/1993 | European Pat. Off. . |
| 43 06 754 | 10/1993 | Germany . |

*Primary Examiner*—David Mis
*Attorney, Agent, or Firm*—Jacobson, Price, Holman & Stern, PLLC

[57] ABSTRACT

The atomic frequency oscillator comprises a resonance cell (41) placed in a microwave resonator (53) surrounded by an electromagnetic shield (58). A laser module (10) emits a light beam which reaches the resonance cell and is used for optically pumping rubidium into the resonance cell. The light beam is conducted from the laser module to the resonance cell by an optical fiber (14) passing through the electromagnetic shield. The optical path traveled by the light beam does not include any beamsplitter. At least one controller uses the light beam conducted by the optical fiber for controlling the injection current and/or the temperature of the laser diode so as to stabilize the light emission frequency. The resonance cell serves both as resonance cell for controlling an oscillator (54) generating via a frequency multiplier (55) the signal for exciting the microwave resonator and as cell for controlling the laser diode (11).

14 Claims, 1 Drawing Sheet

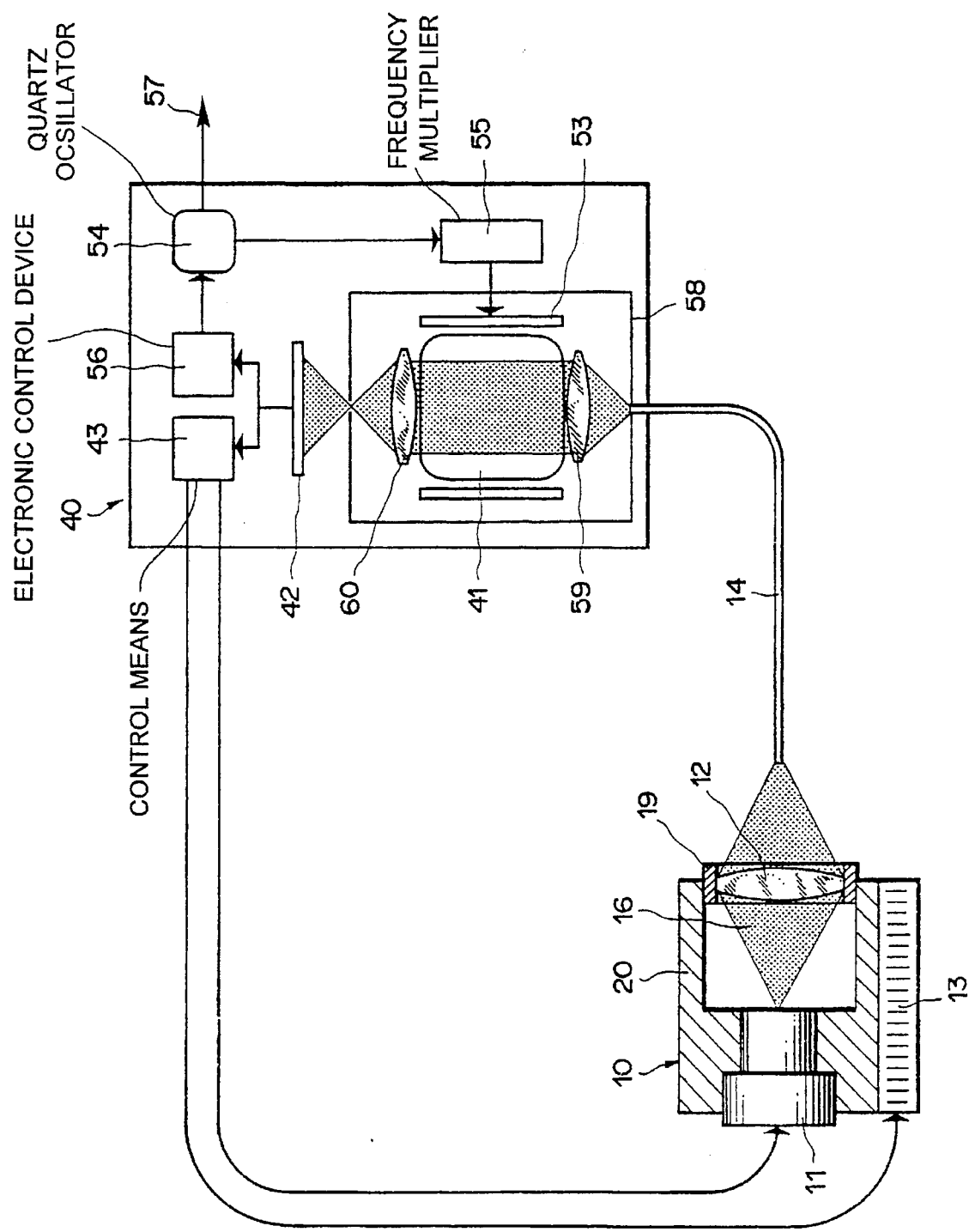

ATOMIC FREQUENCY OSCILLATOR

BACKGROUND OF THE INVENTION

This invention relates to atomic frequency oscillators, and more particularly to an atomic frequency oscillator of the type having a resonance cell placed in a microwave resonator surrounded by an electromagnetic shield, a laser module situated outside the electromagnetic shield and emitting a light beam which reaches the resonance cell, the light beam being used for optically pumping a gas into the resonance cell.

U.S. Pat. No. 5,387,881 to the present assignee describes an atomic frequency oscillator. This patent may be referred to for a detailed study of the operating principle of such oscillators, only those features necessary for understanding the present invention being mentioned here. FIG. 1 of the cited reference illustrates the design of such a device. They generally include a light source 13, a microwave resonator 15, and optical sensor means 17. An electromagnetic shield 20b surrounds the cavity of the microwave resonator; on the one hand, it keeps outside magnetic fields from interfering with the resonator, and on the other hand, it keeps the resonator itself from interfering with other components, such as the light source or the optical sensor means. The cavity of the microwave resonator contains a resonance cell 16 containing a gas, e.g., a rubidium or cesium vapor. A quartz oscillator associated with a frequency multiplier 11 generates the signal for exciting the microwave resonator. The light source generates a light beam which reaches the resonance cell and, by optical pumping, produces a population reversal between the hyperfine levels F=1 and F=2 of the ground state of the rubidium atoms. The resonance cell becomes practically transparent when all the atoms have reached the upper hyperfine level F=2. It is equally possible to carry out the optical pumping in such a way that the population reversal takes place toward the lower hyperfine level F=1. Then, by means of the oscillator, a frequency corresponding to the transition energy between the hyperfine levels is applied to the cavity of the microwave resonator, i.e., a frequency close to 6835 MHz in the case of rubidium. The result is a hyperfine transition, so that the population reversal is destroyed. The cell becomes more opaque again. The quantity of light reaching the optical sensor means is therefore minimal when the frequency of the oscillator, after multiplication, corresponds to the transition frequency. In this way, the oscillator is controlled by the very stable and well-defined frequency corresponding to the separation energy of the hyperfine levels.

In the example of the above-mentioned U.S. patent, the light source used is a lamp, shown in FIG. 2, containing a mixture of rubidium and argon, and placed within an exciting coil. This arrangement is complicated and expensive. Furthermore, it takes up a great deal of space, and the lamp must necessarily be placed near the absorption cell. Thus these two elements interfere with each other, and a grid 51 must be provided to limit such interference. What is more, the energy output of this device is poor. Hence this design is hardly suitable to applications in which cost and size pay an important part, and in which the cell must be insulated as effectively as possible from out side interference. It has therefore been sought in the prior art to replace the light source by a source not having these drawbacks, e.g., by a laser diode.

Japanese Laid-Open Application No. 3,078,319 (Anritsu Corporation) describes another atomic frequency oscillator using a laser diode with stabilized frequency as the light source. In FIG. 1b in particular, in element 24, the beam of the laser diode is seen to be separated by means of a beam-splitter into a measuring beam and a control beam. The control beam reaches an optical resonator 24d, and a photosensor 24e supplies a signal used by control means 24f, 24g, 24h, 24i to control the current injection of the laser diode so that it emits precisely at the resonance frequency of the optical resonator 24e.

There are other systems for stabilization of laser diodes in which the emission frequency is controlled by the absorption frequency of a cell containing a gas, e.g., rubidium vapor, selectively attenuating certain wavelengths. The emission of the laser diode can then be adjusted so that the intensity of the beam passing through the cell is minimal, which amounts to locking up the emission frequency to the peak absorption frequency of the cell.

However, the system disclosed in above-mentioned Japanese Laid-Open Application No. 3,078,319 of Anritsu has a number of drawbacks making its use problematic. Part of the light beam emitted by the laser diode is reflected by the surface of the beam-splitter and returned toward the laser diode. This feedback of light into the laser diode modifies certain emission characteristics, such as the wavelength or the mode of emission, and therefore makes stabilization very difficult. Several solutions have been proposed for reducing, but not eliminating, the undesirable feedback: by treating the faces of the beam-splitter with antireflective coatings, by disaligning the beam-splitter in relation to the optical axis, or by using an optical insulator. Although such operations do improve the device, they entail complications and additional costs. Furthermore, upon temperature fluctuations, the distance between the laser diode and the interface of the beam-splitter changes because of the dilation. The phase and/or amplitude of the light returned to the laser diode therefore depends upon the temperature, making it difficult to predict how the device will perform. In addition, the positioning of the various components is complicated in this design. The absorption cell, which may be quite large in volume according to the chosen gas, must be positioned in the optical path of the light beam, i.e., near the laser diode and the measuring circuit. If the laser diode is placed on a printed circuit, it may be difficult to fix the absorption cell there and to adjust it correctly.

Moreover, in this design the laser diode, the components of the atomic oscillator, and the photosensor 24e are inadequately protected against the electromagnetic interference caused mutually and from the outside. Even putting an electromagnetic shield around the microwave resonator would solve the problem only incompletely since this shield would have to have openings a few millimeters in diameter to allow the laser beam coming from the laser diode to enter, then leave. Thus, the shield could perform its task only very insufficiently.

Devices other than atomic frequency oscillators have naturally been proposed in which the light beam necessary for controlling a laser diode is taken off by means of an optical fiber placed directly in front of the laser diode. European Patent No. 0 479 118 to Dornier describes such a device. However, it uses a single-mode optical fiber 8, difficult to put to work and requiring precautions for the alignment with the laser diode. Moreover, a single-mode fiber is not capable of conveying a light beam with the required conditions of stability. It is, in fact, very difficult to keep coupling losses stable with a single-mode fiber. Hence this device is suitable only for applications in which the stability demanded of the operating light beam is not very critical—in this patent, for fiber optics sensor devices of the type described. Nowhere in this reference is it suggested that the device might also be adapted to an atomic frequency oscillator, nor how it would then be necessary to modify it.

The feedback problem is not at all solved by the foregoing patent to Dornier. This solution therefore can not easily be applied to an atomic frequency oscillator, for in order to effect the separation between the operating light beam and the controlling light beam, it is necessary in this design, too, to provide a beam-splitting element, here in the form of a fiber optics coupler 10. However, this type of coupler is at least as difficult to produce as a beam-splitter. The light entering the prior art couplers passes through an optical interface which returns part of the light toward the laser diode 2 through the optical fiber.

Furthermore, coupling a single-mode fiber to a Fabry-Perot cavity 12 as is done generates a very great feedback. Hence it is not possible to use the teaching of this patent for an atomic frequency oscillator, in which abrupt changes of the mode of emission of the laser diode are absolutely catastrophic. Those skilled in the art, wishing to solve the feedback problems mentioned in connection with the Anritsu reference (Japanese No. 3,078,319), would therefore be rather dissuaded by this patent to Dornier (European Patent No. 0 479 118) from using an optical fiber in the case of an atomic frequency oscillator, aside from the fact that the device described there would then have to be greatly modified.

In the above-mentioned design of Anritsu, the beam-splitter separates the light beam emitted by the laser diode into two beams—a measuring beam and a controlling beam—of substantially equal intensity. Now, the control means can generally do with a small fraction, typically about 2 or 3%, of the light intensity required by the atomic frequency oscillator, whereas in this design they receive the same intensity. The laser diode must therefore operate at needlessly high power, thus reducing its life span, hastening aging, generating unwanted heating, and wasting energy.

It will be noted that the problem of the power to be furnished to the laser diode is not solved by the above-mentioned patent to Dornier any more than by the Anritsu proposal. Conventional fiber optics couplers in fact split the incoming light beam into two beams of equal intensity. Consequently, the control means receive a light intensity equal to the rest of the device, even though they could do with a fraction of that intensity in many applications.

For several years now, owing to the advent of compact disks and laser printers, for example, laser diodes are mass-produced on a large scale and have therefore become very economical. In certain fields of application, they are even increasingly replacing conventional gas lasers owing to their great advantages of miniaturization, long life, efficiency, and ease of execution.

Thus, there are currently a large number of different types of laser diodes, e.g., double-heterojunction diodes, DBR (distributed Bragg reflector) diodes, vertical-cavity diodes, etc., corresponding to a large number of different needs.

Double-heterojunction laser diodes of the AsGaAl type, for instance, find use in a great many different applications. They emit laser light with a wavelength between 750 nm and 880 nm, close to the visible spectrum and adapted to the usual silicon photoelectric receivers. The light frequency emitted by this type of diodes depends upon two parameters: the injection current causes the frequency to vary by 3 GHz/mA, or 0.006 nm/mA;
the temperature causes the frequency to vary by 30 GHz/° C., or 0.06 nm/° C.

For an application in an atomic frequency oscillator, it is necessary to have a laser source emitting at an absolutely stable frequency. The emission frequency must therefore be stabilized by controlling the injection current and/or the temperature of the laser diode. Steady current sources can be designed producing a current of 150 mA with an accuracy of ±5 µA. If this current is applied to a laser diode, the frequency inaccuracy therefore will be about $df/f = 5 \cdot 10^{-8}$. Over a long period of time, it is difficult to guarantee a more accurate temperature of the diode than ±1 mK. This corresponds to a df/f error of $8 \cdot 10^{-8}$.

For atomic frequency oscillators, the accuracy yielded by the foregoing means proves to be insufficient. Moreover, even if it were possible to maintain a sufficiently constant current and temperature, variations due to aging of the laser diode could not be compensated for with this method. It is therefore necessary to stabilize the laser diode with the aid of an outside reference element.

SUMMARY OF THE INVENTION

It is an object of this invention to provide an atomic frequency oscillator exhibiting the advantages of prior art designs without the mentioned drawbacks.

A further object of the invention is to provide an atomic frequency oscillator which is simple, inexpensive, and compact, while offering high precision, a particular object being to improve the effectiveness of the shield around the microwave resonator.

Another object of this invention to provide an atomic frequency oscillator wherein all sources of feedback in the laser diode are reduced as much as possible.

A further object of this invention is to provide an atomic frequency oscillator which makes possible limitation of the power to be supplied to the laser diode.

Still another object of the invention to provide such an oscillator in which variations of reflection and feedback due to temperature fluctuations, especially in the laser module, are substantially or totally eliminated.

To this end, in the atomic frequency oscillator according to the present invention, of the type initially mentioned, the light beam is conducted from the laser module to the resonance cell by an optical fiber passing through the electromagnetic shield.

Thus, it is possible to restrict the opening necessary for introducing light into the shield to the diameter of an optical fiber. Furthermore, this optical fiber makes it possible to place the laser module very freely in the device and so to optimize the positioning of the various elements according to the constraints relating to space, to structure, or to electromagnetic or heat interference, for instance.

According to another feature, the laser module comprises a laser diode controlled by control means using a controlling light beam made up of at least part of the light emitted by the front face of the laser diode for controlling the injection current and/or the temperature of the laser diode, so as to stabilize the light emission frequency. The invention is preferably carried out with ordinary laser diodes such as are commonly available on the market, of the DBR or VCSEL (vertical cavity) type, or preferably of the Fabry-Perot type, not requiring any particular precautions during manufacture or assembly.

Another feature is the elimination of the beam-splitting element on the optical path traveled by the light beam between the laser diode and the resonance cell. Furthermore, the same light beam is used for the control as for the optical pumping into the resonance cell. Problems connected with a beam-splitter are thus avoided, and the laser diode can operate at the minimum power necessary for the optical pumping of the gas into the resonance cell. Aging and heating of the laser diode are thus decreased; and disregarding the losses or possible intentional reductions of power by means of a diaphragm, all the energy consumed by the diode is used for the measuring or transmission application. Hence it is possible to limit the operating power of the laser diode.

According to another feature, a single cell containing a gas, e.g., rubidium or cesium vapor, is used both as a resonance cell for the atomic frequency oscillator and as an absorption cell for controlling the light frequency emitted by the laser diode. The size of the device as a whole is thus appreciably reduced. With the provision of temperature control means, the temperatures of the laser diode and the lens placed in front of the laser diode can be controlled simultaneously.

BRIEF DESCRIPTION OF THE DRAWING

Other objects and advantages of the invention will be preferred come apparent from the following detailed description of a embodiment thereof, taken in conjunction with the accompanying drawing, the sole figure of which is a diagram illustrating the aforementioned preferred embodiment.

DESCRIPTION OF THE PREFERRED EMBODIMENT

The atomic frequency oscillator comprises a laser module 10 frequency-controlled by a cell containing an atomic or molecular vapor (e.g., of rubidium or cesium). Laser module 10 includes a laser diode 11 which emits a light beam 16. In principal, the use of various types of laser diode in the laser module may be envisaged, e.g., laser diodes having a Fabry-Perot cavity, a vertical cavity, or of the DBR type. In the embodiment being described, the laser diode 11 used is an AsGaAl laser diode having a double heterojunction structure. The laser diode is preferably optimized and encapsulated so as to emit light on a single face, called the front face. By means of a focusing lens 12 placed in front of laser diode 11, the divergent light emitted by laser diode 11 is collected and focused in order to couple a multi-mode optical fiber 14 in such a way as to collect the greatest part of the light intensity emitted. Lens 12 is fixed to a case 20 by means of a lens support 19 made of synthetic material or, preferably, of metal. Lens 12 itself may be made of a synthetic material or of glass; the shape of lens 12 is shown only diagrammatically in the drawing. Lens 12 may possibly be composed of a group of lenses in stead. The use of a multi-mode optical fiber 14 permits alignment with and coupling to laser diode 11 which is less critical as regards feedback than in the case of a single-mode fiber.

Case 20 of the laser module is temperature-stabilized owing to heat control means 13. These means preferably take the form of a Peltier element. Laser diode 11, encapsulated so as to emit a light beam 16 from its front face, is fixed in an aperture of case 20.

The reflections caused by the surface of focusing lens 12 and returned toward laser diode 11 are not particularly troublesome inasmuch as lens 12 is placed very close to laser diode 11. This type of feedback is less critical for the laser diode. Nonetheless, in order to minimize the reflections, lens 12 may be provided with antireflective coatings.

In one embodiment of the invention, heat control means 13 are disposed so as to control simultaneously the temperature of laser diode 11 and that of lens 12. By means of this design, the temperature of laser diode 11, lens 12, and the space between them can be kept constant. In this way, the optical feedback due to lens 12 remains absolutely constant in phase and in amplitude, thus avoiding abrupt changes of emission mode. Alternatively, optical fiber 14 may be coupled directly to laser diode 11, without any intervening lens 12.

In order to limit heat transfer as much as possible, an air gap may be created in the cavity between laser diode 11 and lens 12. This gap may also be filled with a gas such as xenon limiting heat transfer, as is proposed, for example, in U.S. Pat. No. 5,195,102 to McLean et al., or in the previously mentioned U.S. Pat. No. 5,387,881.

The light beam emitted by laser diode 11 is conveyed by multi-mode optical fiber 14 to the atomic frequency oscillator 40. Fiber 14 passes through an electromagnetic shield 58 which encloses a microwave resonator 53 and a resonance and absorption cell 41. The opening in shield 58 is minimal and is preferably of just the diameter necessary for fiber 14 to pass through.

By means of a lens 59, the beam is collimated upon leaving optical fiber 14 and is caused to pass through resonance and absorption cell 41. Another lens 60, on the other side of cell 41, concentrates the beam in such a way as to cause it to pass through a second small-diameter opening in shield 58. The light passing through the opening is measured by optical sensor means 42 placed outside shield 58.

Cell 41 contains an atomic (rubidium or cesium, for instance) or molecular vapor. The light received by optical sensor means 42 is minimal when the light frequency is equal to the peak absorption frequency of the gas in the absorption cell, i.e., when there is maximum absorption. Sensor means 42 supply a signal to means 43 for controlling laser diode 11.

The injection current of laser diode 11 is controlled through means 43 so that the signal received by optical sensor means 42 is always minimal, i.e., so that the light frequency emitted corresponds to the absorption frequency of the gas in cell 41.

In this preferred embodiment, control means 43 act solely upon the injection current applied to laser diode 11 in order to vary the light frequency emitted. However, it is quite possible to stabilize the light frequency emitted by acting through heat control means 13 upon the temperature of the laser diode 11, or to act simultaneously upon the temperature and upon the injection current of laser diode 11.

By acting upon the injection current of laser diode 11, its emission frequency is modified, but also the light intensity emitted. If the absorption peak of the gas used is not very steep, sensor means 42 are liable to detect variations due more to the variation in amplitude than to the variation in frequency. It may then be necessary to carry out a correction, e.g., by providing for it in control means 43, or by subtracting the signal measured before absorption cell 41 from the signal measured after it.

The same light beam is likewise used in atomic frequency oscillator 40 for optical pumping of the atoms into resonance and control cell 41. A single light beam thus serves simultaneously as operating beam and control beam.

Cell 41 is placed in a microwave resonator 53 fed by a quartz oscillator 54, the frequency of which is multiplied by a suitable predetermined factor, e.g., 1360, in a frequency multiplier 55. Multiplier 55 acts both as a frequency multiplier and as a synthesizer. Oscillator 54 also supplies an output signal 57 characterized by a very stable and very well-defined frequency.

When the frequency of the light reaching cell 41 is close to the resonance frequency characteristic of the kind of atom contained in the cell, the light intensity transmitted and received by optical sensor means 42 varies resonantly. The signal sent by sensor means 42 is processed by an electronic control device 56 to correct the frequency of quartz oscillator 54 and to keep it in the predetermined ratio to the resonance frequency characteristic of the atomic vapor.

In this embodiment, a single photosensor 42 is used both for subjecting laser diode 11 to the absorption frequency of the gas in cell 41 and for subjecting oscillator 54 to a frequency linked by the factor fixed in frequency multiplier 55 to the resonance frequency of this gas.

For the example of rubidium, the optical absorption frequency is $3.8 \times 10^{12}$ Hz, whereas the resonance frequency is $6.835 \times 10^9$ Hz. The frequency of quartz oscillator 54 is 5 MHz and is increased by frequency multiplier 55 to the resonance frequency.

In this embodiment, the microwave resonator is an atomic resonator having a rubidium cell. However, the invention also applies to resonators with a cesium cell or a cell with any other atomic or molecular vapor or mixture of vapors. This might also be an atomic jet resonator, e.g., with a rubidium or cesium jet.

What is claimed is:

1. An atomic reference oscillator comprising:
   an electromagnetic shield,
   a microwave resonator disposed within said electromagnetic shield,
   a resonance cell disposed within said microwave resonator,
   a gas contained in said resonance cell, an optical fiber passing through said electromagnetic shield,
   control means, and
   a laser module situated outside said electromagnetic shield, said laser module comprising a laser diode controlled by said control means,
   said laser diode emitting a light beam for optically pumping said gas in said resonance cell via said optical fiber
   said control means using at least part of said light beam to stabilize the light emission frequency of said laser diode,
   the optical path traveled by said light beam being free of any beam-splitter.

2. The atomic reference oscillator of claim 1, further comprising optical sensor means situated outside said electromagnetic shield for measuring the intensity of a portion of said light beam transmitted through said resonance cell.

3. The atomic reference oscillator of claim 1, wherein said laser module comprises a lens for coupling said optical fiber to said laser diode and temperature control means for simultaneously controlling the temperatures of said laser diode and said lens.

4. The atomic reference oscillator of claim 1, wherein said optical fiber is coupled directly to said laser diode.

5. The atomic reference oscillator of claim 1, wherein said control means stabilize the light emission frequency of said laser diode by controlling the injection current of said laser diode.

6. The atomic reference oscillator of claim 5, wherein said control means use said light beam conveyed by said optical fiber for controlling the injection current of said laser diode to stabilize the light emission frequency.

7. The atomic reference oscillator of claim 5, further comprising oscillator means and a frequency multiplier, said oscillator means generating via said frequency multiplier a signal for exciting said microwave resonator, said resonance cell serving both as resonance cell for controlling said oscillator means and as cell for controlling said laser diode.

8. The atomic reference oscillator of claim 7, further comprising optical sensor means situated outside said electromagnetic shield for measuring the intensity of a portion of said light beam transmitted through said resonance cell.

9. The atomic reference oscillator of claim 8, wherein said optical sensor means comprise an optical sensor for measuring the intensity of said portion and supplying a signal used by said control means for regulating the injection current of said laser diode to stabilize the frequency of the light emitted by said laser diode, further comprising electronic control means for correcting the frequency emitted by said oscillator means.

10. The atomic reference oscillator of claim 1, wherein said control means stabilize the light emission frequency of said laser diode by controlling the temperature of said laser diode.

11. The atomic reference oscillator of claim 10, wherein said laser module comprises a lens for coupling said optical fiber to said laser diode and temperature control means for simultaneously controlling the temperatures of said laser diode and said lens.

12. The atomic reference oscillator of claim 10, wherein said control means use said light beam conveyed by said optical fiber for controlling the temperature of said laser diode to stabilize the light emission frequency.

13. The atomic reference oscillator of claim 1, wherein said control means stabilize the light emission frequency of said laser diode by controlling the injection current and the temperature of said laser diode.

14. The atomic reference oscillator of claim 13, wherein said control means use said light beam conveyed by said optical fiber for controlling the injection current and the temperature of said laser diode to stabilize the light emission frequency.

* * * * *